(12) United States Patent
Saegusa et al.

(10) Patent No.: US 9,397,015 B2
(45) Date of Patent: Jul. 19, 2016

(54) SEMICONDUCTOR DEVICE AND SEMICONDUCTOR DEVICE CASING

(71) Applicant: FUJI ELECTRIC CO., LTD., Kawasaki-shi (JP)

(72) Inventors: Naoki Saegusa, Matsumoto (JP); Takashi Katsuki, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/642,695

(22) Filed: Mar. 9, 2015

(65) Prior Publication Data

US 2015/0279754 A1     Oct. 1, 2015

(51) Int. Cl.
*H01L 23/10* (2006.01)
*H01L 23/057* (2006.01)
*H01L 23/24* (2006.01)
*H01L 23/373* (2006.01)

(52) U.S. Cl.
CPC .............. *H01L 23/057* (2013.01); *H01L 23/24* (2013.01); *H01L 23/3735* (2013.01); *H01L 2224/48091* (2013.01); *H01L 2224/48247* (2013.01); *H01L 2224/48472* (2013.01); *H01L 2924/181* (2013.01); *H01L 2924/19107* (2013.01)

(58) Field of Classification Search
CPC ............................. H01L 23/10; H01L 23/053
USPC ........................................................ 257/690
See application file for complete search history.

(56) References Cited

U.S. PATENT DOCUMENTS

| | | | |
|---|---|---|---|
| 5,408,383 A | 4/1995 | Nagasaka et al. | |
| 2007/0277607 A1* | 12/2007 | Ino | 73/514.16 |
| 2013/0009298 A1* | 1/2013 | Ota et al. | 257/676 |
| 2014/0233188 A1* | 8/2014 | Terasawa et al. | 361/719 |

FOREIGN PATENT DOCUMENTS

| | | |
|---|---|---|
| JP | H04-354354 A | 12/1992 |
| JP | H08-130291 A | 5/1996 |
| JP | 2002-329892 A | 11/2002 |

* cited by examiner

*Primary Examiner* — Marc Armand
(74) *Attorney, Agent, or Firm* — Rabin & Berdo, P.C.

(57) ABSTRACT

A semiconductor device has an insulating substrate, a semiconductor element which is mounted on the insulating substrate, a hollow casing which surrounds a peripheral edge of the insulating substrate to contain the semiconductor element therein, and a sealing material which is charged into the casing to seal the inside of the casing. The casing has protrusion portions each of which partially protrudes from an upper surface of the casing. Thus, it is possible to provide a semiconductor device in which poor external appearance or lowering of adhesion to a cover can be prevented even when a sealing material is injected up to the vicinity of an upper surface of a casing.

19 Claims, 7 Drawing Sheets

SEMICONDUCTOR DEVICE AND SEMICONDUCTOR DEVICE CASING

CROSS-REFERENCE TO RELATED APPLICATION

This application is based on, and claims priority to, Japanese Patent Application No. 2014-001612, filed on Mar. 28, 2014, the contents of which are entirely incorporated herein by reference.

BACKGROUND OF THE INVENTION

1. Field of the Invention

The present invention relates to a semiconductor device and a semiconductor device casing.

2. Description of the Background Art

A power semiconductor module in which one or two or more power semiconductor elements (semiconductor chips) are included in a casing and the inside of the casing is sealed with a sealing material has been known as a semiconductor device. Bonding wires etc. made of aluminum are used for these power semiconductor elements in order to electrically connect the semiconductor chips mounted on an insulating substrate to an electric circuit or terminals formed in the insulating substrate.

The sealing material inside the casing is composed of an epoxy resin etc. and serves for protecting and insulating the semiconductor chips, the bonding wires, etc. which are received in the casing. To this end, in the power semiconductor module, the sealing material is charged into the casing to reach a height at which the bonding wires inside the casing can be sufficiently covered and insulated. On the other hand, there is a request for reduction of the size and thickness of the power semiconductor module, and it is desirable that the height of the casing is also made low as long as there is no problem. When the sealing material which is liquefied is injected into the casing, the sealing material is injected up to the vicinity of an upper surface of the casing so that the insulation property inside the casing can be achieved by the sealing material in balance with the reduction of the size and thickness.

Since the sealing material is injected up to the vicinity of an upper edge of the casing, the sealing material may run onto the upper surface of the casing during the injection. In addition, the sealing material may run onto the upper surface of the casing during conveyance before the injected sealing material is solidified.

The sealing material running on the upper surface of the casing may cause poor external appearance of the power semiconductor module. When the casing is covered with a cover and adhesively fixed to the cover, the sealing material running on the upper surface of the casing may lower the adhesion because the upper surface which is the bonded surface of the casing is not flat.

Provision of a flange in an inner surface of the casing (JP-A-8-130291) or provision of a step portion in an inner surface of the casing (JP-A-4-354354) has been proposed for preventing the sealing material from running on the upper surface of the casing.

However, the flange or the step portion provided in the inner surface of the casing is formed to face toward the inside of the casing so that the sealing material can be prevented from reaching the upper surface of the casing. Thus, the injection amount of the sealing material is limited up to a height where the flange or the step portion is formed. Therefore, the flange or the step portion cannot satisfactorily meet the request to inject the sealing material up to a position as close to the upper surface of the casing as possible in order to enhance the insulation property. Even when the sealing material can be injected up to the vicinity of the upper surface of the casing, it is difficult to prevent the sealing material from running on the upper surface of the casing.

SUMMARY OF THE INVENTION

The invention is to favorably solve the problem of the aforementioned background-art semiconductor device. An object of the invention is to provide a semiconductor device and a semiconductor device casing in which poor external appearance and lowering of adhesion to a cover can be prevented even when a sealing material is injected up to the vicinity of an upper surface of a casing.

A semiconductor device and a semiconductor device casing are provided as follows in order to achieve the aforementioned object.

The semiconductor device according to the invention is provided with: an insulating substrate; a semiconductor element which is mounted on the insulating substrate; a hollow casing which surrounds a peripheral edge of the insulating substrate to contain the semiconductor element therein; and a sealing material which is charged into the casing to seal the inside of the casing. In the semiconductor device according to the invention, the casing has a protrusion portion which protrudes partially from an upper surface of the casing.

The semiconductor device casing according to the invention serves as a hollow casing which surrounds a peripheral edge of an insulating substrate to contain a semiconductor element therein and which is filled with a sealing material, the casing including: a protrusion portion which protrudes partially from an upper surface of the casing.

In the semiconductor device according to the invention, the protrusion portion is formed partially in the upper surface of the casing and the sealing material can be prevented from running on the protrusion portion even when the sealing material runs on the upper surface of the casing. Accordingly, poor external appearance can be prevented. In addition, flatness of the upper surface of the casing can be maintained so that adhesion when the upper surface of the casing and a cover are adhesively bonded to each other can be secured sufficiently.

DETAILED DESCRIPTION OF THE INVENTION

A semiconductor device and a semiconductor device casing according to an embodiment of the invention will be described specifically with reference to the drawings.

Figure 1:
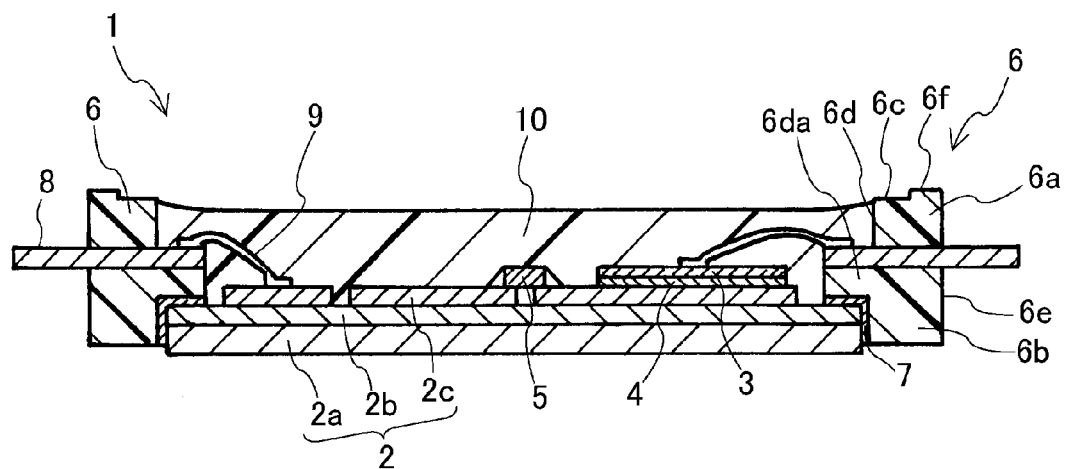
FIG. 1 is a sectional view of a power semiconductor module according to an embodiment of the invention.

FIG. 1 shows a sectional view of a power semiconductor module as the semiconductor device according to the embodiment of the invention. In a power semiconductor module 1 shown in FIG. 1, a semiconductor chip 3 is mounted on an insulating substrate 2. The insulating substrate 2 includes a metal substrate 2a, an insulating plate 2b provided on the metal substrate 2a, and metallic foil 2c provided on the insulating plate 2b. The insulating plate 2b is made of a ceramics material such as silicon nitride, alumina or aluminum nitride, or an organic insulating material such as an epoxy resin. Specifically, the metallic foil 2c is, for example, copper foil. The metallic foil 2c is selectively formed on the insulating plate 2b. Thus, an electrode formed on a lower surface of the semiconductor chip 3 or a circuit pattern connected to leads which will be described later can be formed.

The semiconductor chip 3 is bonded on a wiring pattern made of the metallic foil 2c, for example, by solder 4 serving as a joining material so that the semiconductor chip 3 is electrically bonded to the wiring pattern. For example, the semiconductor chip 3 is a diode chip or a transistor chip. An IGBT chip, an MOSFET chip etc. can be used as the transistor chip. The kind of the semiconductor chip 3 is however not particularly limited. In addition, silicon carbide (SiC), gallium nitride (GaN) in addition to single crystal silicon can be used as a substrate of the semiconductor chip 3. An example in which the semiconductor chip 3 serves as a diode chip is described in FIG. 1. Incidentally, although one semiconductor chip 3 mounted on the metallic foil 2c of one insulating substrate 2 is illustrated in FIG. 1, two or more semiconductor chips 3 may be mounted on the metallic foil 2c of one insulating substrate 2.

In addition, a capacitor chip 5 is connected to the wiring pattern made of the metallic foil 2c in FIG. 1.

A casing 6 is attached to a peripheral edge of the insulating substrate 2 mounted with the semiconductor chip 3. Specifically, the casing 6 has a hollow (frame-like) substantially rectangular parallelepiped shape and is made of an insulation resin such as a PPS resin. In the casing 6, an upper end portion 6a is formed as an opening and a sealing material 10 can be injected into a hollow space inside the casing 6 from the upper end portion 6a. A lower end portion 6b of the casing 6 is bonded to the metal substrate 2a and the insulating plate 2b of the insulating substrate 2 by an insulation adhesive agent 7. Due to the bonding using the insulation adhesive agent 7, insulation property between the insulating substrate 2 and the casing 6 can be secured and a gap between the insulating substrate 2 and the casing 6 can be eliminated so that the sealing material 10 can be prevented from leaking out from the gap.

The casing 6 has a step portion 6da protruding inward from a heightwise intermediate part of an inner surface 6d. With the provision of the step portion 6da, the thickness of the casing 6 in the step portion 6da is larger than the thickness of the casing 6 in the upper end portion 6a of the casing 6, i.e. larger than the distance between the inner surface 6d and an outer surface 6e of the casing 6. One ends of leads 8 each made of a copper plate are exposed in and attached to the step portion 6da. The one ends of the leads 8 exposed in the step portion 6da of the inner surface 6d of the casing 6 are electrically connected to the metallic foil 2c of the insulating substrate 2 or the electrode of the semiconductor chip 3 by bonding wires 9.

The leads 8 and the casing 6 are molded integrally by insert molding. The leads 8 extend in the thickness direction of the casing 6 and the other end portions of the leads 8 appear on the outside from the outer surface 6e of the casing 6.

The internal space of the casing 6 is filled with the sealing material 10 for sealing members such as the semiconductor chip 3. Examples of the sealing material 10 include a gel-like sealing material including silicon as a main component and a sealing material made of a thermosetting resin such as an epoxy resin. Of these examples of the sealing material 10, the sealing material made of the thermosetting resin is preferred because it has high insulation property and high heat-resistance property. In the embodiment, the thermosetting resin, more specifically, the epoxy resin is used as the sealing material 10. Of course, it is not intended to exclude the gel-like sealing material. The sealing material 10 which is liquefied but not solidified is injected into the internal space from the opening of the upper end portion 6a of the casing 6 and heated. Thus, the sealing material 10 is solidified to seal the semiconductor chip 3, the bonding wires 9, etc.

In order to secure insulation property of the bonding wires 9, the sealing material 10 is injected so that the injection amount of the sealing material 10 can reach a height at which the sealing material 10 can cover the bonding wires 9 sufficiently, specifically, a height at which the bonding wires 9 are covered by at least 1 mm. On the other hand, in order to reduce the size and the thickness, the casing 6 has a height which can be made low as long as the insulation property is not hindered. Therefore, the sealing material 10 is injected with a predetermined amount with which the height inside the casing 6 reaches the vicinity of an upper surface 6c of the casing 6.

The power semiconductor module 1 according to the embodiment has protrusion portions 6f provided partially in the upper surface 6c of the casing 6 in order to prevent poor external appearance even when the sealing material 10 runs on the upper surface 6c of the casing 6 due to the flowing of the sealing material during injection of the sealing material 10 or due to vibration during conveyance after the injection.

The planar shape of each protrusion portion 6f will be described with reference to a plan view of FIG. 2. Incidentally, description of the semiconductor chip 3, the capacitor chip 5, the bonding wires 9 and the sealing material 10 is omitted in FIG. 2 in order to make it easy to understand the invention. In the power semiconductor module 1 according to the embodiment, two protrusion portions 6f are formed in each corner portion of the casing 6 separately and respectively in positions adjacent to the corner portion along a longitudinal direction and a lateral direction of the casing. The casing 6 has four corner portions so that eight protrusion portions 6f in total are formed.

Figure 3:
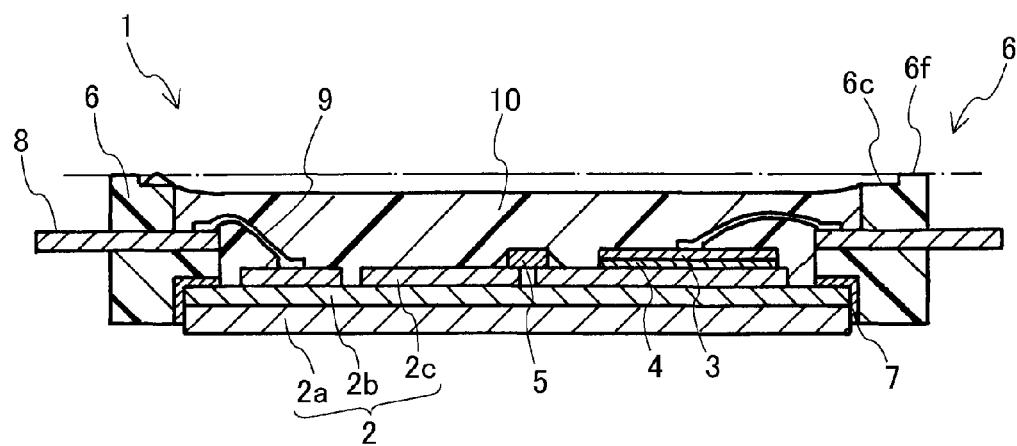
FIG. 3 is a sectional view of the power semiconductor module in FIG. 1.
Figure 4:
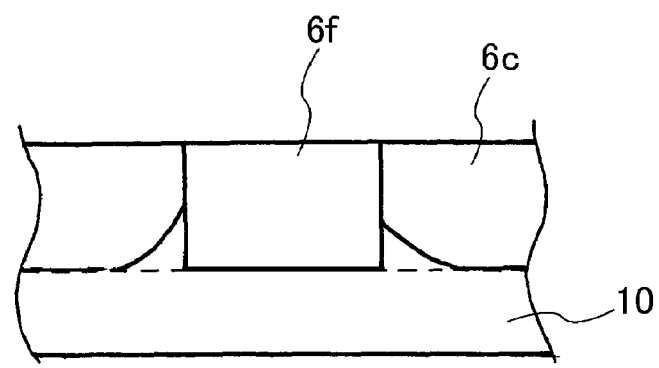
FIG. 4 is a partially enlarged plan view of the power semiconductor module in FIG. 1.

Functions and effects of the power semiconductor module 1 according to the embodiment will be described with reference to FIG. 3 and FIG. 4. FIG. 3 is a sectional view showing a situation when the sealing material 10 runs on the upper surface 6c of the casing 6. FIG. 4 is a planar partially schematic view showing the situation when the sealing material 10 runs on the upper surface 6c of the casing 6. Even when the sealing material 10 runs on the upper surface 6c of the casing 6 during injection of the sealing material 10 or during conveyance before the injected sealing material 10 is solidified, the sealing material 10 goes around to side surfaces of the protrusion portions 6f but does not run on upper surfaces thereof. Accordingly, the external appearance of the power semiconductor module 1 according to the embodiment can be prevented from being poor. In addition, the working efficiency when the sealing material 10 is injected can be improved.

Figure 5:
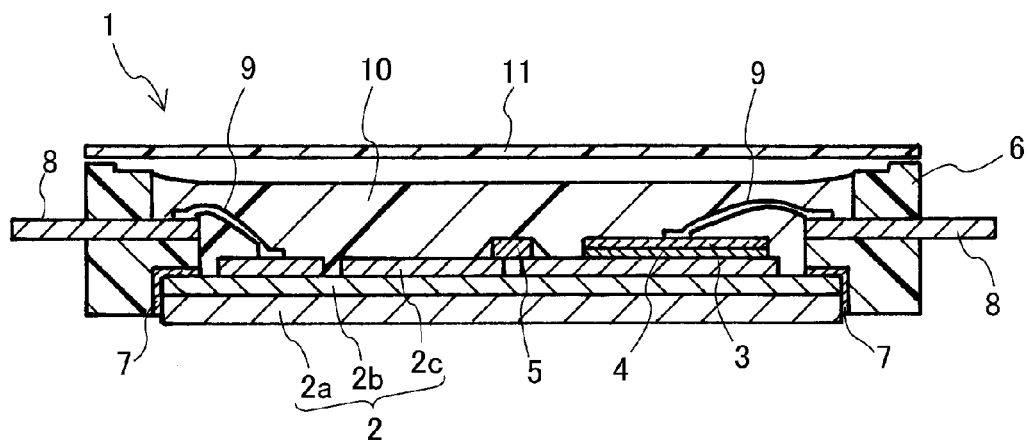
FIG. 5 is a sectional view of the power semiconductor module provided with a cover.

Further, even when the sealing material 10 runs on the upper surface 6c of the casing 6, the sealing material 10 can be prevented from running onto the protrusion portions 6f. Accordingly, in the power semiconductor module 1 according to the embodiment, the adhesion when a cover 11 is adhesively fixed is not lowered, as shown in FIG. 5 which is a perspective view when the cover 11 is attached.

In the power semiconductor module 1 according to the embodiment, at least three protrusion portions 6f are required in order to be able to support the cover 11 flatly. Of course, when the dimension accuracy of the casing 6 and the accuracy of the height of each of the protrusion portions 6f are taken into consideration, the protrusion portions 6f are preferably provided adjacently to the corner portions and in the longitudinal direction and the lateral direction of the casing as shown in FIG. 2, in order to be able to surely support the cover 11.

In addition, it is desirable that each of the protrusion portions 6f is located in a position not interfering with a pressing tool when a bonding wire 9 is wire-bonded.

The height of each protrusion portion 6f from the upper surface 6c of the casing 6 may be about 0.1 mm to about 1 mm which is high enough to prevent the sealing material 10 from running on the protrusion portion 6f even when the sealing material 10 runs on the upper surface. As a result of verification made by the present inventors, the thickness of the sealing material 10 in the upper surface 6c of the casing 6 was about 30 μm to about 80 μm when the sealing material 10 ran on the upper surface 6c of the casing 6. Accordingly, it is possible to prevent the sealing material 10 from running on each protrusion portion 6f as long as the height of the protrusion portion 6f is not smaller than about 0.1 mm. On the other hand, when the height of each protrusion portion 6f exceeds about 1 mm, its contribution to reduction of the height of the casing 6 is dimmed.

As shown in FIG. 1, the casing 6 has a shape in which the thickness of a lower portion below the step portion 6da is larger than the thickness of the upper end portion 6a. Therefore, in the case where the casing 6 is molded by a mold and the temperature of the casing 6 is decreased to room temperature, the thermal contraction amount varies between the upper end portion 6a and the lower end portion 6b of the casing 6. As a result, the casing 6 inevitably has a warped shape in which the longitudinal center becomes convex. Although depending on the dimensions of the casing, the warp amount in the center portion is larger by about 0.1 mm than that in longitudinal end portions of the casing.

When such a warp of the casing 6 is taken into consideration, the protrusion portions 6f are preferably provided in the vicinities of the longitudinal end portions of the upper surface 6c of the casing 6 so that the cover 11 can be supported flatly on the casing 6 easily and the adhesion can be improved.

In addition, when the warp of the casing 6 is taken into consideration, the height of each of the protrusion portions 6f provided in the vicinities of the longitudinal end portions of the upper surface 6c of the casing 6 is preferably made relatively larger than the height of each of the protrusion portions 6f provided near to the longitudinal center portion of the upper surface 6c of the casing 6 so that the cover 11 can be supported flatly on the casing 6 easily and the adhesion can be improved.

When a not-shown flat plate is placed on the casing 6 in place of the cover 11, the power semiconductor module 1 according to the embodiment can be used for mounting and laminating other components on the flat plate. When other components are mounted and laminated on the flat plate, high density mounting can be achieved. In the case where the flat plate is placed on the casing 6 in the background-art power semiconductor module, it is difficult to secure flatness of the flat plate and parallelism with the upper surface 6c of the casing 6 when the sealing material 10 runs on the upper surface 6c of the casing 6. On the other hand, the power semiconductor module 1 according to the embodiment has an effect that flatness of the flat plate and parallelism with the upper surface 6c of the casing 6 can be secured because the flat plate is supported on the protrusion portions 6f even when the sealing material 10 runs on the upper surface 6c of the casing 6.

In addition, the power semiconductor module 1 in which the flat plate is placed on the casing 6 may be used for a structure in which a spring is provided above the flat plate and the metal substrate 2a of the power semiconductor module 1 is pressed against and fixed to radiation fins making contact with the metal substrate 2a by the urging force of the spring so that an excellent contact property can be secured between the metal substrate 2a and the radiation fins to thereby improve the heat radiation. Also in this case, the power semiconductor module 1 has an effect that flatness of the flat plate and parallelism with the upper surface 6c of the casing 6 can be secured.

Modifications of the protrusion portions 6f of the casing 6 will be described with reference to the plan views of FIG. 6 and FIG. 7.

Figure 6:
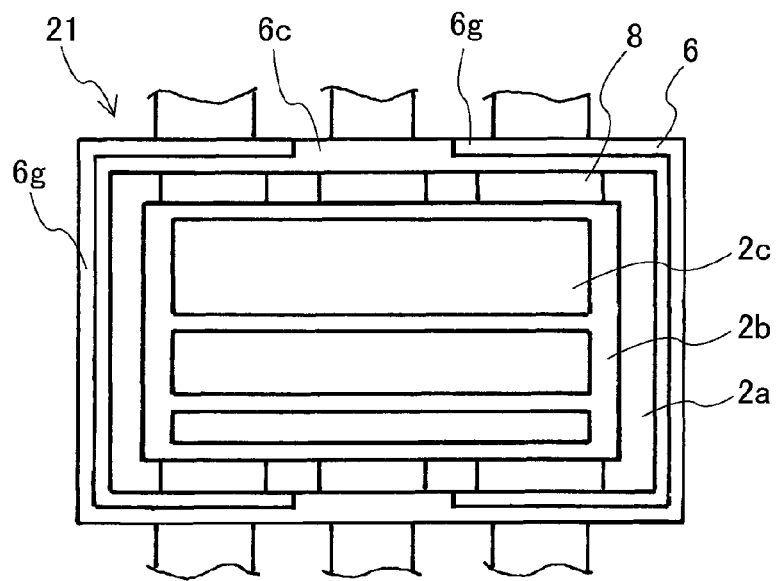
FIG. 6 is a plan view of a modification of the power semiconductor module according to the embodiment of the invention.

In a semiconductor device 21 according to the modification shown in FIG. 6, an upper surface 6c of a casing 6 is halved in the thickness direction so that a part on the side of an outer surface 6e whose height is larger than the height of a part on the side of an inner surface 6d can serve as a protrusion portion 6g. The protrusion portion 6g is not formed in a longitudinal center portion of the upper surface 6c of the casing 6. Since the protrusion portion 6g is not formed in the longitudinal center portion of the upper surface 6c of the casing 6, it becomes easy to support a cover 11 flatly against the aforementioned warp of the casing 6 so that the adhesion can be improved.

Figure 2:
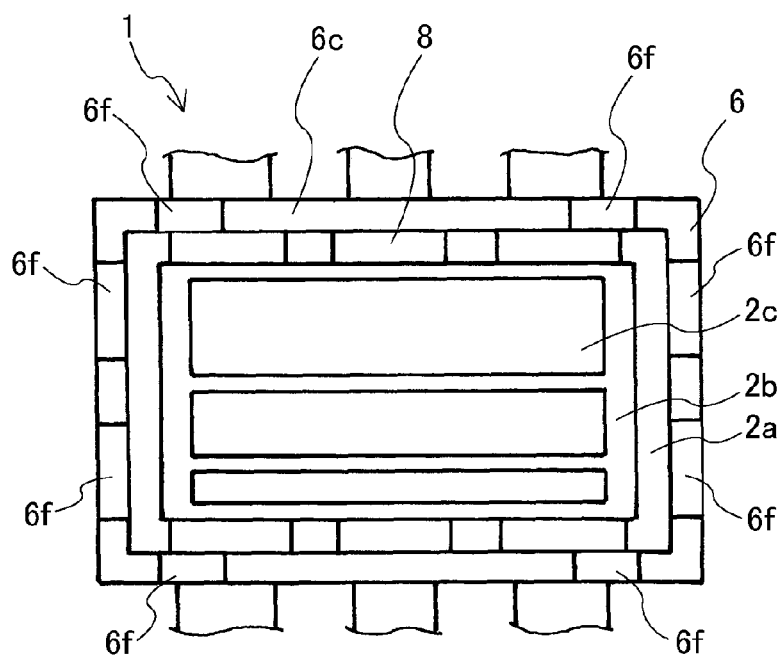
FIG. 2 is a plan view of the power semiconductor module in FIG. 1.
Figure 7:
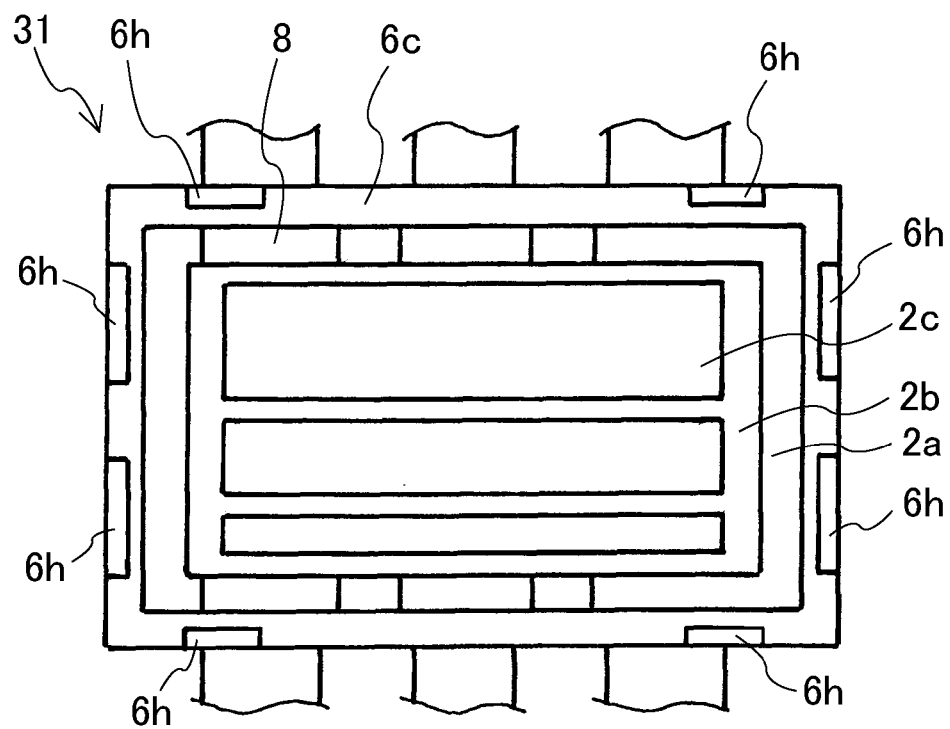
FIG. 7 is a plan view of another modification of the power semiconductor module according to the embodiment of the invention.

In a semiconductor device 31 according to the modification shown in FIG. 7, protrusion portions 6h are formed substantially in the same positions in an upper surface 6c of a casing 6 as the protrusion portions 6f shown in FIG. 2 but the thickness of each of the protrusion portions 6h is halved in the thickness direction. The protrusion portions 6h are formed on the side of an outer surface 6e of the casing 6.

The protrusion portion 6g shown in FIG. 6 and the protrusion portions 6h shown in FIG. 7 are different in protrusion shape from the protrusion portions 6f shown in FIG. 2 but the height of each protrusion in the protrusion portion 6g and the protrusion portions 6h may be made equal to the height of each of the protrusion portions 6f shown in FIG. 2. In addition, when a warp of the casing 6 is taken into consideration, the protrusion portion 6g or the protrusion portions 6h provided in the vicinities of longitudinal end portions of the upper surface 6c of the casing 6 may be made relatively higher than the protrusion portion 6g or the protrusion portions 6h provided near to a longitudinal center portion of the upper surface 6c of the casing 6.

Figure 8:
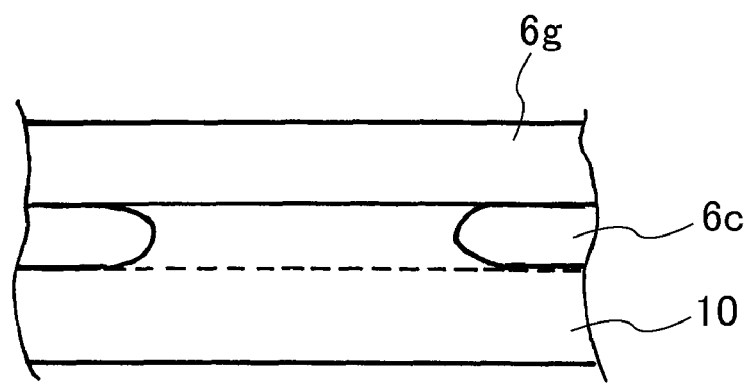
FIG. 8 is a partially enlarged plan view of the power semiconductor module in FIG. 6.
Figure 9:
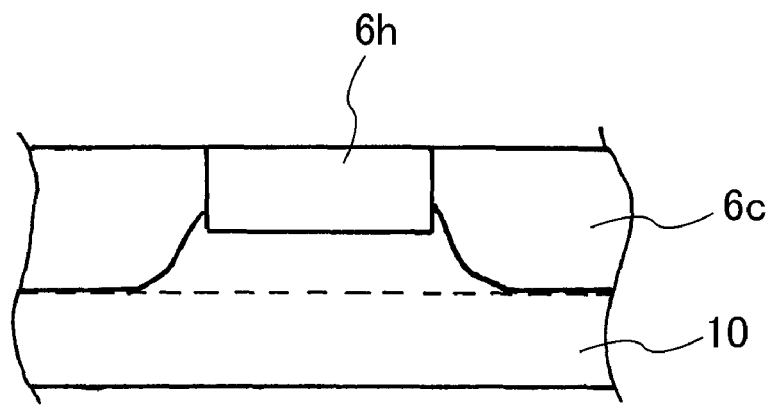
FIG. 9 is a partially enlarged plan view of the power semiconductor module in FIG. 7.

Functions and effects of the modification shown in FIG. 6 will be described with reference to FIG. 8. Functions and effects of the modification shown in FIG. 7 will be described with reference to FIG. 9. FIG. 8 and FIG. 9 are planar schematic views showing a situation when a sealing material 10 runs on the upper surface 6c of the casing 6 in the case of these modifications.

As apparent from FIG. 8 or FIG. 9, the thickness of the protrusion portion 6g or the protrusion portions 6h is thin and comparable to the thickness obtained by dividing the thickness of the upper surface 6c of the casing 6. Accordingly, even when the sealing material 10 runs on the upper surface 6c of the casing 6 during injection of the sealing material 10 or during conveyance before the injected sealing material 10 is solidified, the sealing material 10 goes around to side surfaces of the protrusion portion 6g or the protrusion portions 6h but does not run on an upper surface or upper surfaces thereof. Accordingly, external appearance of the power semiconductor module 1 according to the embodiment can be prevented from being poor. In addition, the working efficiency when the sealing material 10 is injected can be improved.

Further, the sealing material 10 can be prevented from running on the protrusion portion 6g or the protrusion portions 6h even when the sealing material 10 runs on the upper surface 6c of the casing 6. Accordingly, the adhesion when the cover 11 is adhesively fixed can be prevented from being lowered.

A reference example of a protrusion portion of a casing 6 will be described with reference to FIG. 10 which is a plan view.

Figure 10:
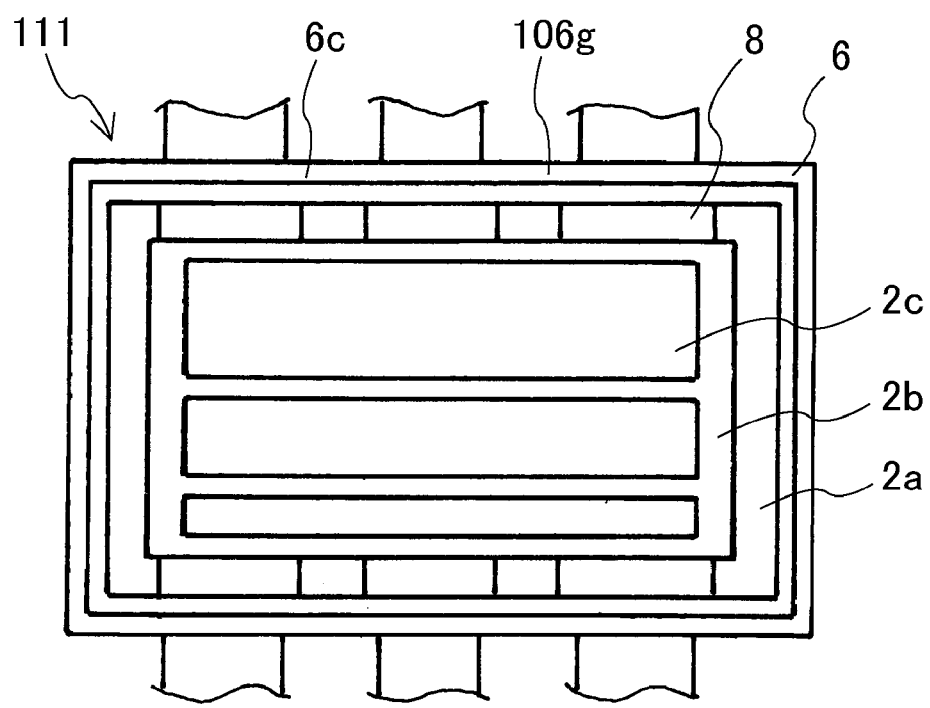
FIG. 10 is a plan view of a power semiconductor module as a reference example.

A power semiconductor module 111 in the reference example shown in FIG. 10 has a protrusion portion 106g similar to that in the modification shown in FIG. 6. The protrusion portion 106g is formed as follows. That is, the upper surface 6c of the casing 6 is halved in the thickness direction so that a part on the side of an outer surface 6e whose height is larger than the height of a part on the side of an inner surface 6d can serve as the protrusion portion 106g. The protrusion portion 106g is different from the protrusion portion 6g shown in FIG. 6 in the point that the protrusion portion 106g is formed all over the periphery on the upper surface 6c of the casing 6. The protrusion portion 106g in the reference example shown in FIG. 10 can hardly support the cover 11 flatly against the casing 6 warped as described above and can achieve less improvement of the adhesion, in comparison with the modification shown in FIG. 6.

Figure 11:
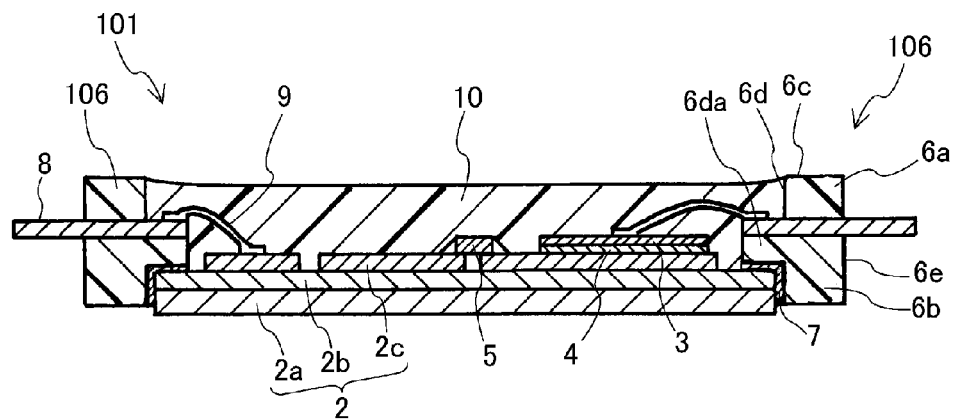
FIG. 11 is a sectional view of a power semiconductor module according to the background art.

A power semiconductor module 101 according to the background art will be described as a comparative example with reference to a sectional view shown in FIG. 11. In FIG. 11, incidentally, the same members as those in the power semiconductor module 1 shown in FIG. 1 are referred to by the same numerals correspondingly and duplicate description thereof will be omitted below.

The power semiconductor module 101 according to the background art shown in FIG. 11 is different from the power semiconductor module 1 according to the embodiment of the invention shown in FIG. 1 in the point that a casing 106 is attached to a peripheral edge of an insulating substrate 2 mounted with a semiconductor chip 3. The casing 106 has the same configuration as the casing 6 of the power semiconductor module 1 according to the embodiment of the invention shown in FIG. 1, except that the casing 106 does not have the protrusion portions 6f formed in the casing 6.

Figure 12:
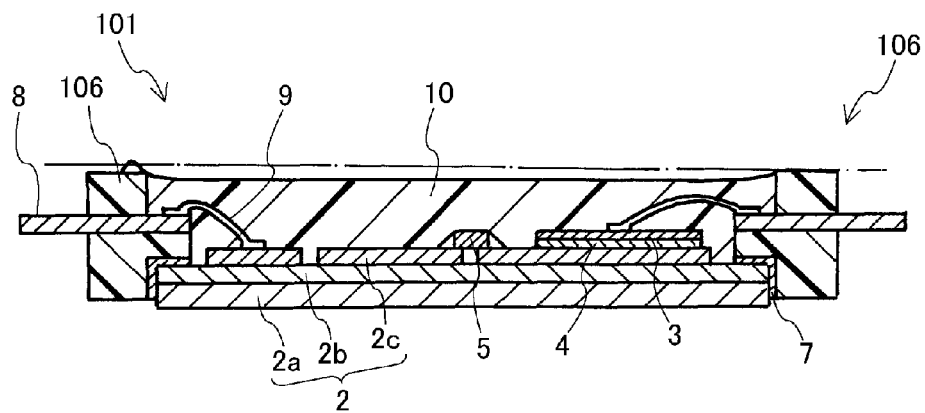
FIG. 12 is a sectional view of the power semiconductor module in FIG. 11.

FIG. 12 shows a sectional view of a situation in which a sealing material 10 injected into an internal space of the casing 106 of the semiconductor module 101 according to the background art runs on an upper surface of the casing 106.

Figure 13:
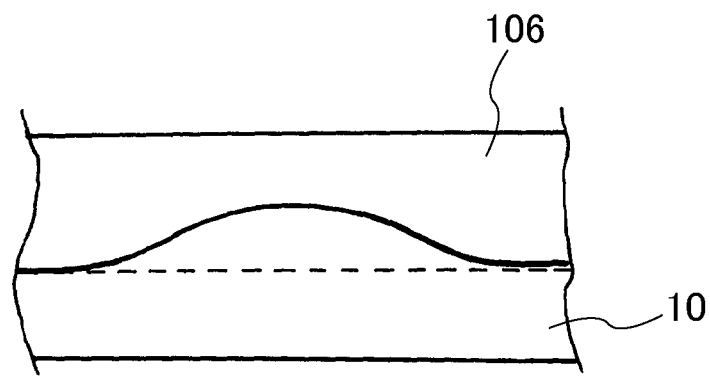
FIG. 13 is a partially enlarged plan view of the power semiconductor module in FIG. 11.

FIG. 13 shows a planar partial schematic view of FIG. 12. When the sealing material 10 runs on the upper surface of the casing 106 as shown in FIGS. 12 and 13, a cover 11 which is placed on the casing 106 cannot be supported flatly. Thus, the adhesion when the cover 11 is adhesively fixed is deteriorated and external appearance is poor.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:
1. A semiconductor device comprising:
   an insulating substrate;
   a semiconductor element which is mounted on the insulating substrate;
   a hollow casing which surrounds a peripheral edge of the insulating substrate to contain the semiconductor element therein; and
   a sealing material which is charged into the casing to seal the inside of the casing; wherein:
   the casing has a plurality of protrusion portions separate from each other and protruding partially from an upper surface of the casing.

2. The semiconductor device according to claim 1, wherein:
   the casing has a box-like shape and at least one of the plurality of protrusion portions is formed in a vicinity of a corner portion of the upper surface of the casing.

3. The semiconductor device according to claim 1, wherein:
   at least one of the plurality of protrusion portions has a thickness obtained by dividing a thickness of the upper surface of the casing.

4. The semiconductor device according to claim 1, wherein:
   the casing has a protrusion portion of the plurality of protrusion portions formed in a vicinity of a longitudinal end portion of the casing and a protrusion portion of the plurality of protrusion portions formed in a vicinity of a longitudinal center portion of the casing, and the protrusion portion formed in the vicinity of the longitudinal end portion of the casing is higher relative to the upper surface than the protrusion portion formed in the vicinity of a longitudinal center portion of the casing.

5. The semiconductor device according to claim 1, wherein:
   a step portion in which a thickness of the casing is large is provided in an inner surface of the casing, and one end portion of a conductive member extending from an inside of the casing to an outside is provided in the step portion.

6. The semiconductor device according to claim 1, further comprising:
   a cover which covers the casing.

7. The semiconductor device according to claim 1, further comprising:
   a flat plate which is placed on the casing.

8. The semiconductor device of claim 1, further comprising:
a cover which covers the casing;
wherein the plurality of protrusion portions support the cover so that a space is formed between the sealing material and the cover.

9. The semiconductor device according to claim 2, wherein:
at least one of the plurality of protrusion portions has a thickness obtained by dividing a thickness of the upper surface of the casing.

10. The semiconductor device according to claim 5, wherein:
the conductive member serves as a lead made of a copper plate, and a bonding wire is further provided to be connected to the lead.

11. A semiconductor device casing serving as a hollow casing which surrounds a peripheral edge of an insulating substrate to contain a semiconductor element therein and which is filled with a sealing material, the casing comprising:
a plurality of protrusion portions separate from each other and protruding partially from an upper surface of the casing.

12. The semiconductor device casing according to claim 11, wherein:
the semiconductor device casing has a box-like shape and at least one of the plurality of protrusion portions is formed in a vicinity of a corner portion of the upper surface of the casing.

13. The semiconductor device casing according to claim 11, wherein:
at least one of the plurality of protrusion portions has a thickness obtained by dividing a thickness of the upper surface of the casing.

14. The semiconductor device casing according to claim 12, wherein:
at least one of the plurality of protrusion portions has a thickness obtained by dividing a thickness of the upper surface of the casing.

15. An apparatus, comprising:
a substrate; and
a casing for a semiconductor device, the casing having an upper surface configured to receive a cover;
wherein the upper surface has at least one protrusion that extends beyond a main part of the upper surface to support the cover: and
wherein the casing further comprises a lateral protrusion extending from an inner wall of the casing, and the lateral protrusion overlaps an edge of the substrate.

16. The apparatus of claim 15, wherein the at least one protrusion extends along at least a portion of an outer perimeter of the casing.

17. The apparatus of claim 15, wherein the at least one protrusion is thinner than the main part of the upper surface.

18. The apparatus of claim 16, wherein the at least one protrusion includes a lower portion and a higher portion, and wherein the higher portion extends farther beyond the main part of the upper surface than does the lower portion.

19. The apparatus of claim 18, wherein the lower portion is closer to a center part of the outer perimeter of the casing than is the higher portion.

* * * * *